United States Patent
Shinichi

(10) Patent No.: US 8,483,345 B2
(45) Date of Patent: Jul. 9, 2013

(54) CIRCUIT AND METHOD FOR RECEIVING SERIAL DATA AND SERIAL DATA TRANSMISSION SYSTEM AND METHOD USING THE SAME

(75) Inventor: Saito Shinichi, Kyoto (JP)

(73) Assignee: Rohm Co., Ltd. (JP)

( * ) Notice: Subject to any disclaimer, the term of this patent is extended or adjusted under 35 U.S.C. 154(b) by 39 days.

(21) Appl. No.: 13/309,881

(22) Filed: Dec. 2, 2011

(65) Prior Publication Data

US 2012/0139593 A1 Jun. 7, 2012

(30) Foreign Application Priority Data

Dec. 3, 2010 (JP) ................................ 2010-270454

(51) Int. Cl.
*H03D 3/24* (2006.01)

(52) U.S. Cl.
USPC ........... 375/376; 375/354; 375/375; 327/156; 327/160

(58) Field of Classification Search
USPC .......... 375/354, 355, 371, 373–376; 327/141, 327/147, 148, 151, 153, 155–157, 160, 162
See application file for complete search history.

(56) References Cited

U.S. PATENT DOCUMENTS

| 7,436,904 B2 * | 10/2008 | Kwak ........................... 375/316 |
| 2003/0190006 A1 * | 10/2003 | Nagano ......................... 375/376 |
| 2012/0105115 A1 * | 5/2012 | Yamamoto et al. ........... 327/156 |

FOREIGN PATENT DOCUMENTS

| JP | 2006-066971 A | 3/2006 |
| JP | 3822632 B2 | 9/2006 |
| JP | 2009-253876 A | 10/2009 |

* cited by examiner

*Primary Examiner* — Dac Ha
(74) *Attorney, Agent, or Firm* — Cantor Colburn LLP

(57) ABSTRACT

A receiving circuit which receives serial data, includes: a voltage controlled oscillator which generates a sampling clock signal having a frequency based on an input control voltage; a first frequency divider which divides the frequency of the sampling clock signal at a division rate M; a second frequency divider which divides a frequency of a clock signal based on the received serial data at a division rate N, N being a real number represented by M×q/p; a frequency comparator which generates a phase/frequency difference signal based on a phase difference between an output signal of the first frequency divider and an output signal of the second frequency divider; and a control voltage generating circuit which generates the control voltage to control a frequency of the voltage controlled oscillator based on the phase/frequency difference signal.

14 Claims, 14 Drawing Sheets

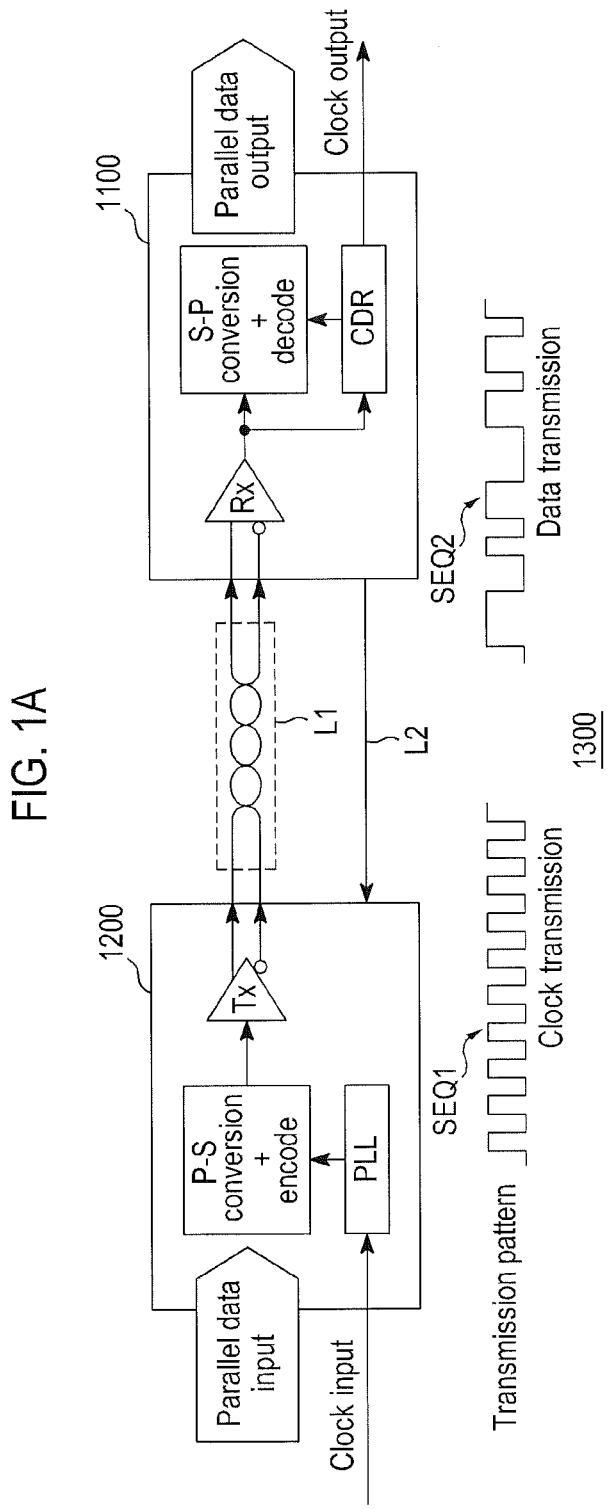

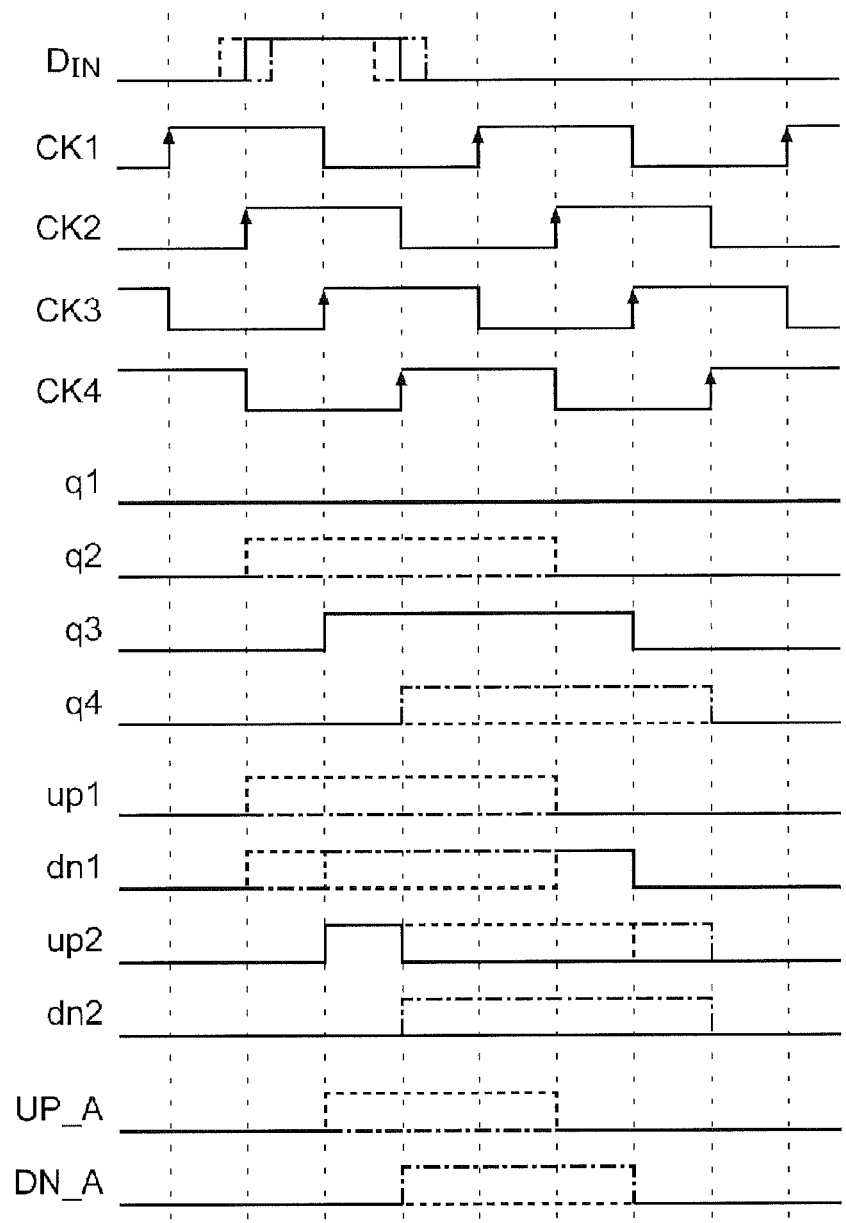

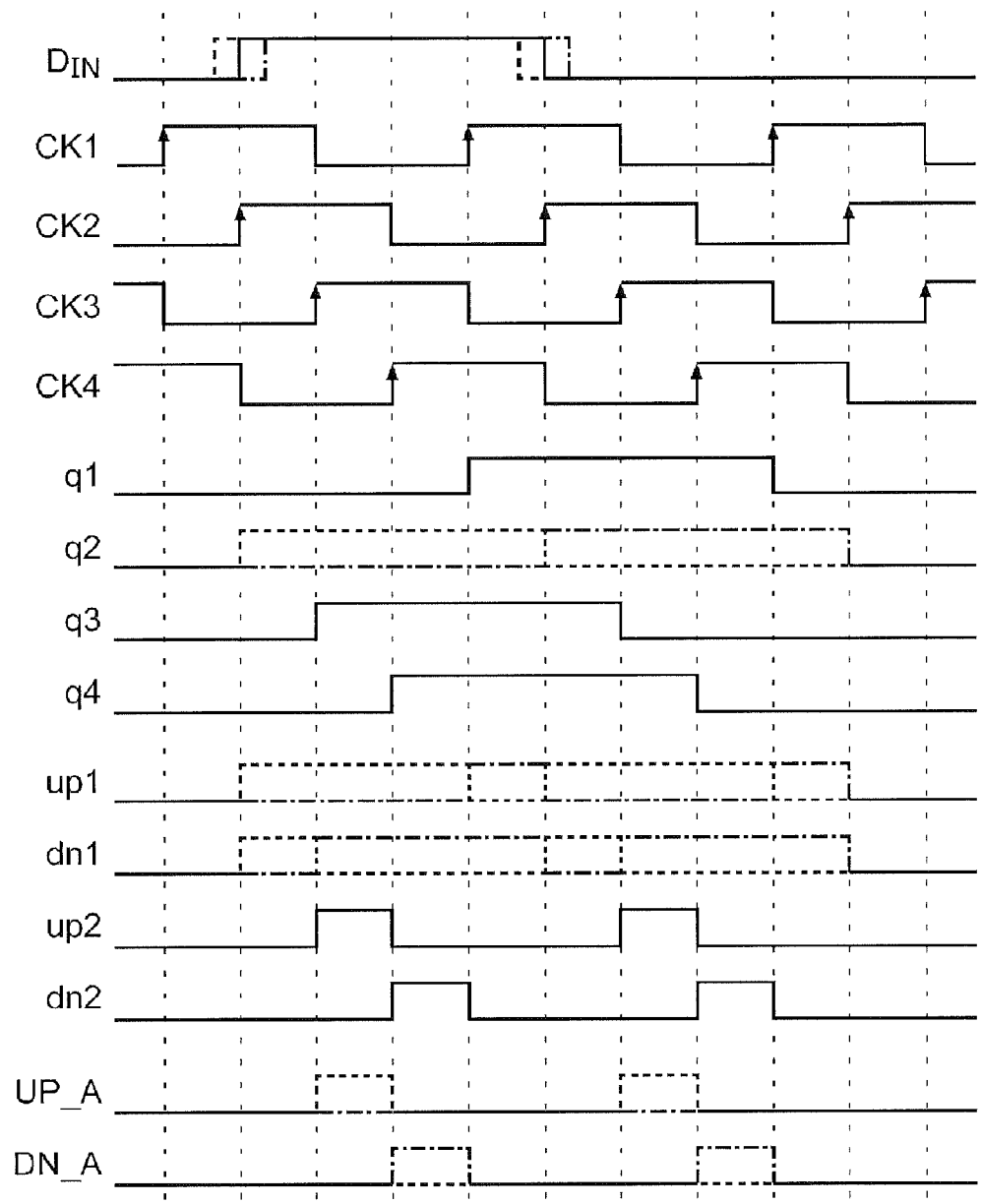

CIRCUIT AND METHOD FOR RECEIVING SERIAL DATA AND SERIAL DATA TRANSMISSION SYSTEM AND METHOD USING THE SAME

CROSS-REFERENCE TO RELATED APPLICATION

This application claims the benefit of Japanese Patent Application No. 2010-270454, filed on Dec. 3, 2010, the disclosure of which are incorporated herein in its entirety by reference.

TECHNICAL FIELD

The present disclosure relates to a serial data transmission technique using a clock data recovery (CDR) circuit.

BACKGROUND

Serial data transmission is used to transmit and receive data between semiconductor integrated circuits through a few number of data transmission lines. For example, in the case of low voltage differential signaling (LVDS) transmission, serial data and a clock signal synchronized with the serial data are transmitted through their respective signal lines. In this case, transmitting the serial data at a high speed exceeding 1 Gbps is difficult due to the effect of a difference in propagation delay between the serial data and the clock signal.

The clock data recovery (CDR) scheme overcomes the problem of a difference in propagation delay between the serial data and the clock signal since the clock signal is transmitted embedded in the serial data. In the CDR scheme, a clock data recovery (CDR) circuit at the receiving side monitors changing points of the serial data, recovers the clock signal based on the detected changing points, and latches the serial data using the recovered clock signal.

FIGS. 1A and 1B are block diagrams showing a conventional serial data transmission system 1300. In the system 1300 of FIG. 1A, a transmitting circuit 1200 and a receiving circuit 1100 are interconnected via a differential transmission line L1 through which serial data embedded with a clock signal propagates and a return transmission line L2 through which a sequence adjustment signal propagates. The transmitting circuit 1200 transmits a clock signal having a predetermined frequency in a first sequence SEQ1. Upon receiving the clock signal from the transmitting circuit 1200, the receiving circuit 1100 recovers a sampling clock signal at the reception side using the received clock signal. The receiving circuit 1100 acknowledges the reception of the clock signal in the first sequence SEQ1 by transmitting a sequence adjustment signal to the transmitting circuit 1200 via the return transmission line L2. Upon receiving the acknowledgement, the transmitting circuit 1200 proceeds to a second sequence SEQ2 where it transmits the serial data synchronized with the previously transmitted clock signal.

In the system 1300 of FIG. 1A, there is a need to return to the first sequence SEQ1 since no synchronization takes place when the transmitting circuit 1200 or the receiving circuit 1100 is reset during transmission of the serial data.

In the system 1300 of FIG. 1B, the transmitting circuit 1200 and the receiving circuit 1100 are connected via the single differential transmission line L1 and are respectively provided with oscillators 1210 and 1110 to generate reference clock signals having the same frequency. This system does not require the return transmission line L2 but cannot change the transmission rate.

SUMMARY

In the light of the above circumstances, the present disclosure provides a transmission technique which is capable of transmitting serial data at a high speed via a single transmission line.

According to one embodiment of the present disclosure, there is provided a receiving circuit which receives serial data generated such that level shift is produced at a rate of 2×q times within p bits (p and q being real numbers). The receiving circuit includes: a voltage controlled oscillator which generates a sampling clock signal having a frequency based on an input control voltage; a first frequency divider which divides the frequency of the sampling clock signal at a division rate M (M being a real number); a second frequency divider which divides a frequency of a clock signal based on the received serial data at a division rate N (N being a real number represented by M×q/p); a frequency comparator which generates a phase/frequency difference signal based on a phase difference between an output signal of the first frequency divider and an output signal of the second frequency divider; and a control voltage generating circuit which generates the control voltage to control a frequency of the voltage controlled oscillator based on the phase/frequency difference signal.

The phrase "level shift is produced at a rate of 2×q times within p bits" may be statistically established. According to this embodiment, since the sampling clock signal can be recovered from the clock signal embedded in the serial data, the serial data can be received using the sampling clock signal. That is, the serial data can be transmitted at a high speed via a single transmission line without using any sequence control or oscillator.

In one embodiment, the serial data include D symbols encoded by 8B/10B, 10B/12B or similar schemes and K symbols which are synchronization control codes inserted at an equal interval between plural D symbols. Continued K symbols bias a frequency distribution to a time base, which may result in difficulty in the recovery of a clock signal. In contrast, an arrangement of K symbols at an equal interval can reduce the bias of the frequency distribution to the time base in the entire serial data including the K symbols, which may result in more reliable recovery of a clock signal in the receiving circuit.

In one embodiment, the D symbols are scrambled. Such scrambling can suppress temporal variation of frequency, which may result in more reliable recovery of a clock signal in the receiving circuit.

In one embodiment, the receiving circuit further includes: a phase comparator which receives the serial data and the sampling clock signal and generates a phase difference signal based on a phase difference between the serial data and the sampling clock signal; and a selector which receives the phase/frequency difference signal and the phase difference signal, selects one of the phase/frequency difference signal and the phase difference signal and outputs the selected signal to the control voltage generating circuit. The phase/frequency difference signal from the frequency comparator is first selected by the selector and then the serial data is extracted by changing the selected phase/frequency difference signal to the phase difference signal from the phase comparator after the voltage controlled oscillator is locked.

Preferably, the voltage control oscillator generates a multiphase clock signal as the sampling clock signal, which includes a plurality of clock signals having different frequencies based on the control voltage, with their phases shifted from each other by an equal interval.

In one embodiment, the phase comparator generates an up signal and a down signal, which are complementarily asserted, as the phase difference signal, and the phase comparator includes: a plurality of flip-flops which are respectively provided for the plurality of clock signals and latch the serial data at timings of the corresponding clock signals; a plurality of first logic gates which are respectively provided for odd-numbered flip-flops and are configured in such a manner that an i-th first logic gate (i being a natural number) generates an internal up signal asserted when the output of a (2×i−1)-th flip-flop is unequal to the output of a (2×i)-th flip-flop; a plurality of second logic gates which are respectively provided for even-numbered flip-flops and are configured in such a manner that a j-th second logic gate (j being a natural number) generates an internal down signal asserted when the output of a (2×j)-th flip-flop is unequal to the output of a (2×j+1)-th flip-flop; a third logic gate which generates the up signal based on a plurality of internal up signals generated by the plurality of first logic gates; and a fourth logic gate which generates the down signal based on a plurality of internal down signals generated by the plurality of second logic gates.

According to this embodiment, since the up and down signals proportional to the level shift can be generated with a small delay, it is possible to suppress a jitter of a recovered clock signal and increase trackability of an input clock signal to a jitter.

In one embodiment, the third logic gate asserts the up signal when all of the internal up signals are asserted and the fourth logic gate asserts the down signal when all of the internal down signals are asserted.

The plurality of first logic gates and the plurality of second logic gates may be exclusive OR (EOR) gates and the third and fourth logic gates may be AND (logical product) gates.

In one embodiment, the plurality of clock signals has 4-phases.

In one embodiment, the phase comparator outputs data retained in the plurality of flip-flops as sampled serial data.

In one embodiment, the receiving circuit further includes a serial-parallel converter which performs a serial-parallel operation for the sampled serial data using a clock signal output from the voltage controlled oscillator.

According to another embodiment of the present disclosure, there is provided a transmission system. The transmission system includes a transmitting circuit which generates serial data having level shift produced at a rate of 2×q times within p bits (p and q being real numbers); and one of the above-described receiving circuits, which receives the serial data.

Any combinations of elements of the above embodiments or switches of representations of the present disclosure between methods, apparatuses and so on are may be effectively considered as other embodiments of the present disclosure.

BRIEF DESCRIPTION OF THE DRAWINGS

FIGS. 1A and 1B are block diagrams showing a conventional serial data transmission system.

FIGS. 10A and 10B are timing charts showing a first operation of the phase comparator in FIG. 9.

FIGS. 11A and 11B are timing charts showing a second operation of the phase comparator in FIG. 9.

DETAILED DESCRIPTION

Figure 1B:
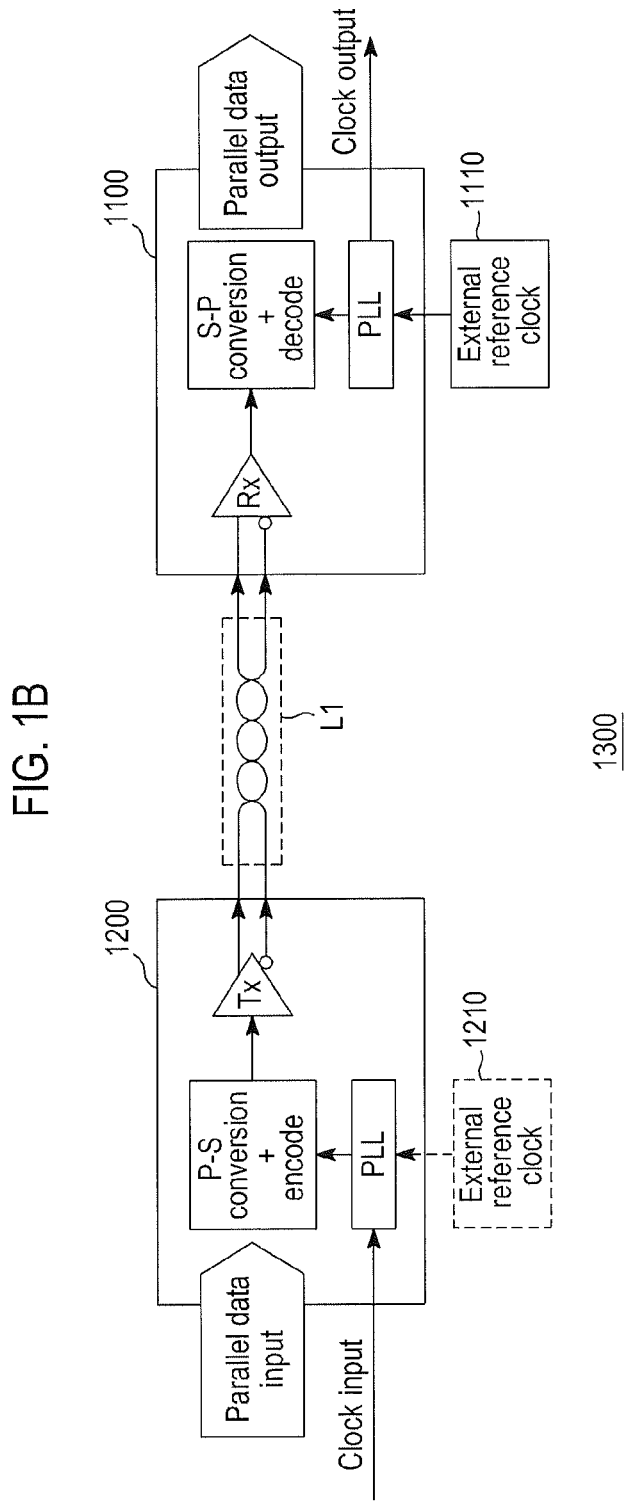

The present disclosure will be now described based on preferred embodiments with reference to the drawings. Throughout the drawings, the same or equivalent elements, members and processes are denoted by the same reference numerals and repeated explanation of which will not be provided. The disclosed embodiments are only examples and do not limit the present disclosure, and all described characteristics and combinations of the embodiments are not necessarily essential for the present disclosure.

In the specification, the phrase "a member A is connected to a member B" is meant to include not only direct physical connection of the member A and the member B but also indirect connection of the member A and the member B via a different member having no effect on the electrical connection therebetween.

Likewise, the phrase "a member C is interposed between a member A and a member B" is meant to include not only direct connection between the member A and the member C or between the member B and the member C but also indirect connection between the member C and the member A or the member B via a different member having no effect on the electrical connection therebetween.

Figure 2:
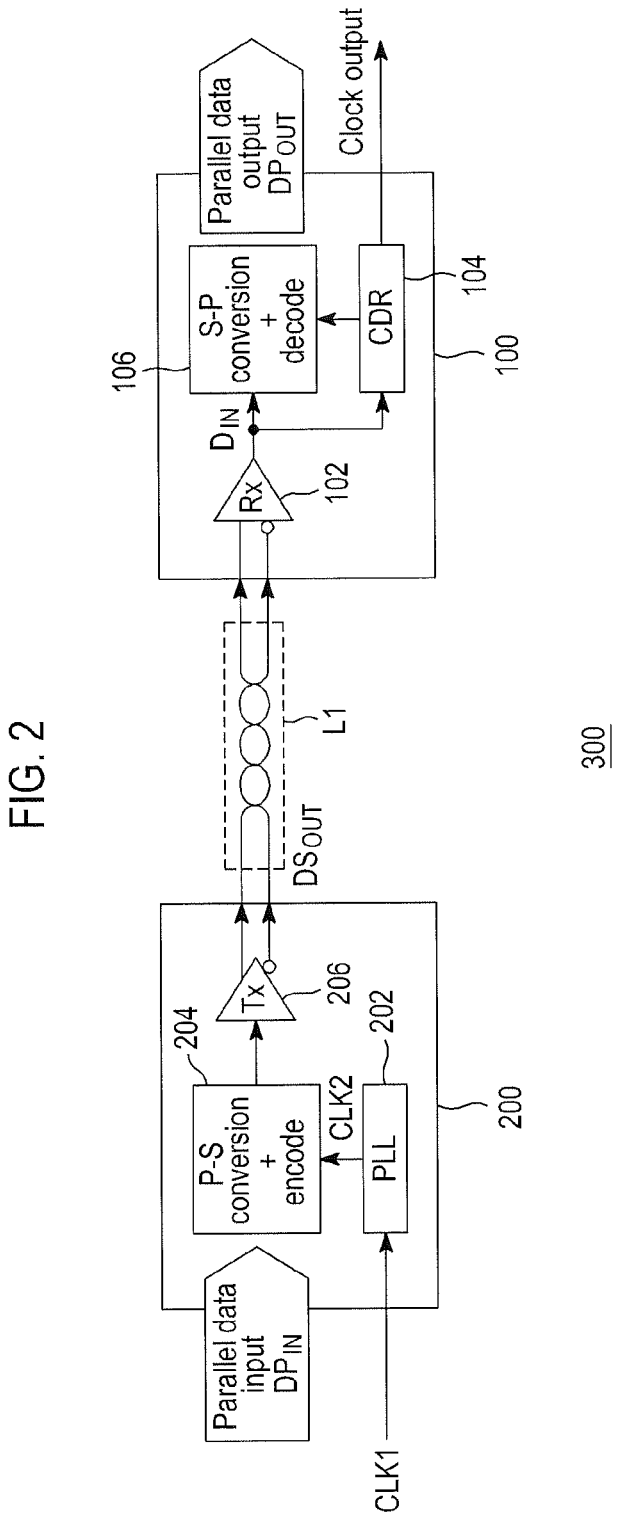
FIG. 2 is a schematic block diagram showing a transmission system according to an embodiment.

FIG. 2 is a schematic block diagram showing a transmission system 300 according to one embodiment. The transmission system 300 includes a transmitting circuit 200, a receiving circuit 100 and a single transmission line L1 interconnecting these circuits. The transmitting circuit 200 generates a transmitting clock signal CLK2 by multiplying an input clock signal CLK1 by means of a phase locked loop (PLL) circuit 202. A signal processing circuit 204 converts parallel data $DP_{IN}$ into serial data in synchronization with the transmitting clock signal CLK2. The signal processing circuit 204 also encodes the serial data to embed a reference clock signal CLK3 (not shown) in the serial data. A differential transmitter 206 sends the serial data to the receiving circuit 100 via the transmission line L1.

A differential receiver 102 in the receiving circuit 100 receives differential serial data $DS_{OUT}$. A CDR circuit 104 extracts the reference clock signal CLK3 embedded in the received serial data $D_{IN}$ and recovers a sampling clock signal CLK4 (clock output) having the same frequency as the transmitting clock signal CLK2. Based on the recovered sampling clock signal CLK4, a signal processing circuit 106 converts the serial data into parallel data $DP_{OUT}$ for further decoding.

The above is an outline of the entire transmission system 300. The transmission system 300 can transmit serial data using only the single transmission line L1 without requiring the transmission line L2 for transmission of the sequence control and adjustment signal required for the system of FIG 1A and the oscillator required for the system of FIG. 1B.

Subsequently, the transmission system 300 of FIG. 2 will be described in more detail. First, the transmitting circuit 200 will be described.

Figure 3:
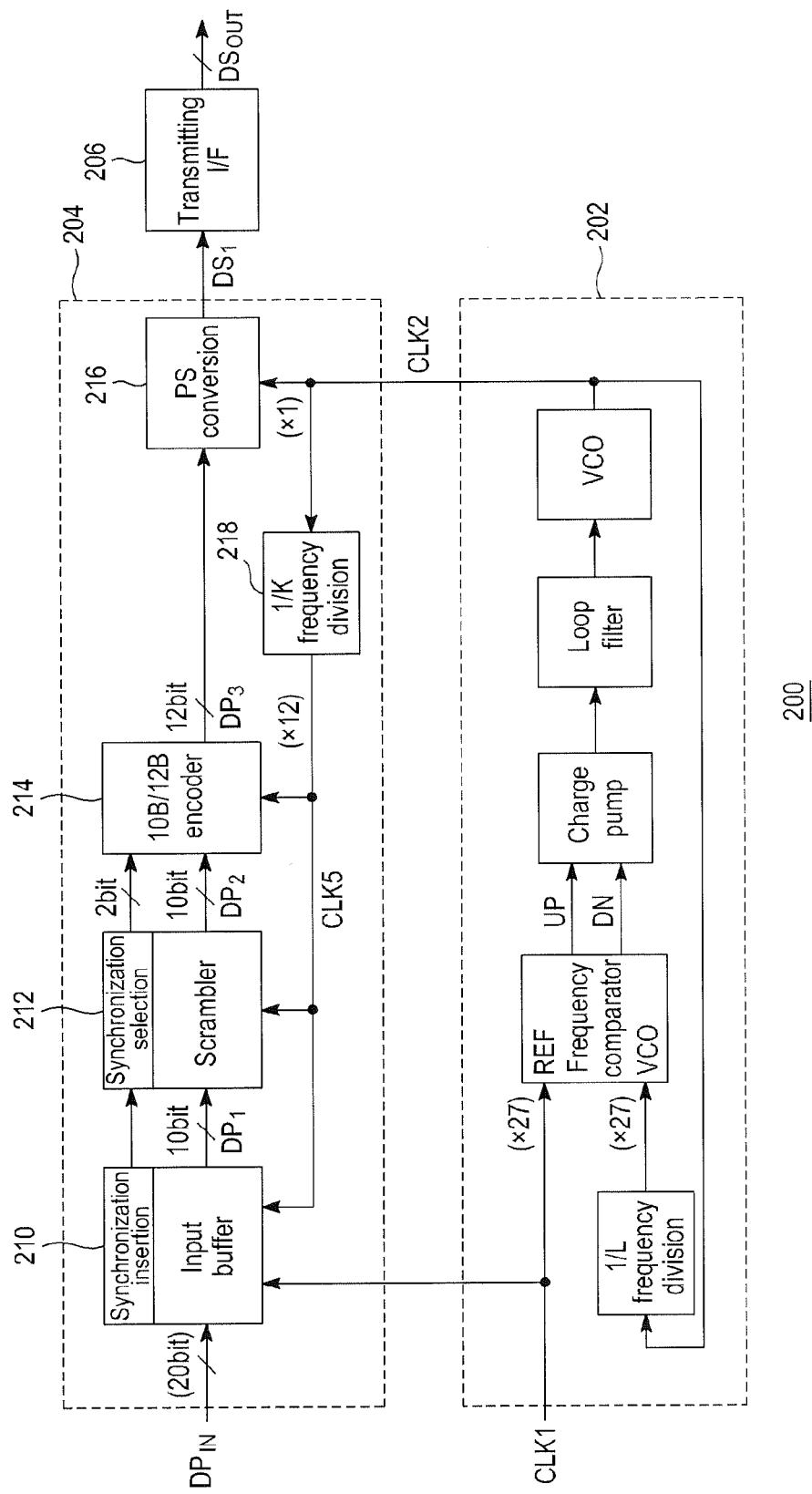
FIG. 3 is a block diagram showing a transmitting circuit according to an embodiment.

FIG. 3 is a block diagram showing a configuration of the transmitting circuit 200 according to an embodiment. The PLL circuit 202 generates a transmitting clock signal CLK2 by L-multiplying an input clock signal CLK1. The PLL circuit 202 has a general configuration and therefore explanation of which will be omitted. In this embodiment, L is 27. In FIG. 3, the cycle of each clock signal is put in parenthesis on the basis of the input clock signal CLK1. For example, the cycle of the input clock signal CLK1 is 27 times the cycle of the transmitting clock signal CLK2.

The signal processing circuit 204 includes an input buffer 210, a scrambler 212, an encoder 214, a parallel-serial converter 216 and a frequency divider 218. The frequency divider 218 generates an intermediate clock signal CLK5 by dividing the frequency of the transmitting clock signal CLK2 at a division rate K (=12). Parallel data $DP_{IN}$ of 20 bits is written to the input buffer 210 in synchronization with the input clock signal CLK1.

The input buffer 210 asserts a control bit to instruct the insertion of synchronization codes at a frequency of one per a predetermined number of times. In this embodiment, the frequency is one per nine times.

When the control bit is asserted, the scrambler 212 outputs the synchronization codes (K symbols) in synchronization with the intermediate clock signal CLK5. Thereafter, 10-bit parallel data $DP_1$ (D symbols) is read out of the input buffer 210 a total of 8 times in synchronization with the intermediate clock signal CLK5. By inserting the synchronization codes at an equal interval, the receiving circuit side can identify a word paragraph without requiring transmission of a synchronization signal (Data Enable) as in the conventional system.

The scrambler 212 begins a scramble with the synchronization codes at the front end. The scrambler 212 performs a stream cipher operation using, for example, a linear feedback shift register (LFSR). The scramble allows the frequency of serial data $DS_{OUT}$ to be averaged in time. As a result, the frequency distribution of the serial data $DS_{OUT}$ is narrowed to ensure recovery of a clock signal in the receiving circuit 100, as will be described later.

The encoder 214 receives 10-bit D symbols (or K symbols) $DP_2$ output from the scrambler 212 at the previous stage and performs a 10B/12B encoding operation to embed these symbols into the reference clock signal CLK3. This 10B/12B encoding can reduce the overhead to 20%, which results in an increase in the effective transmission rate, as compared to an overhead of 25% in the conventional 8B/10B encoding.

The parallel-serial converter 216 converts parallel data $DP_3$ output from the encoder 214 into serial data $DS_1$ using the transmitting clock signal CLK2. The differential transmitter 206 converts the serial data $DS_1$ into a differential signal $DS_{OUT}$.

Figure 4:
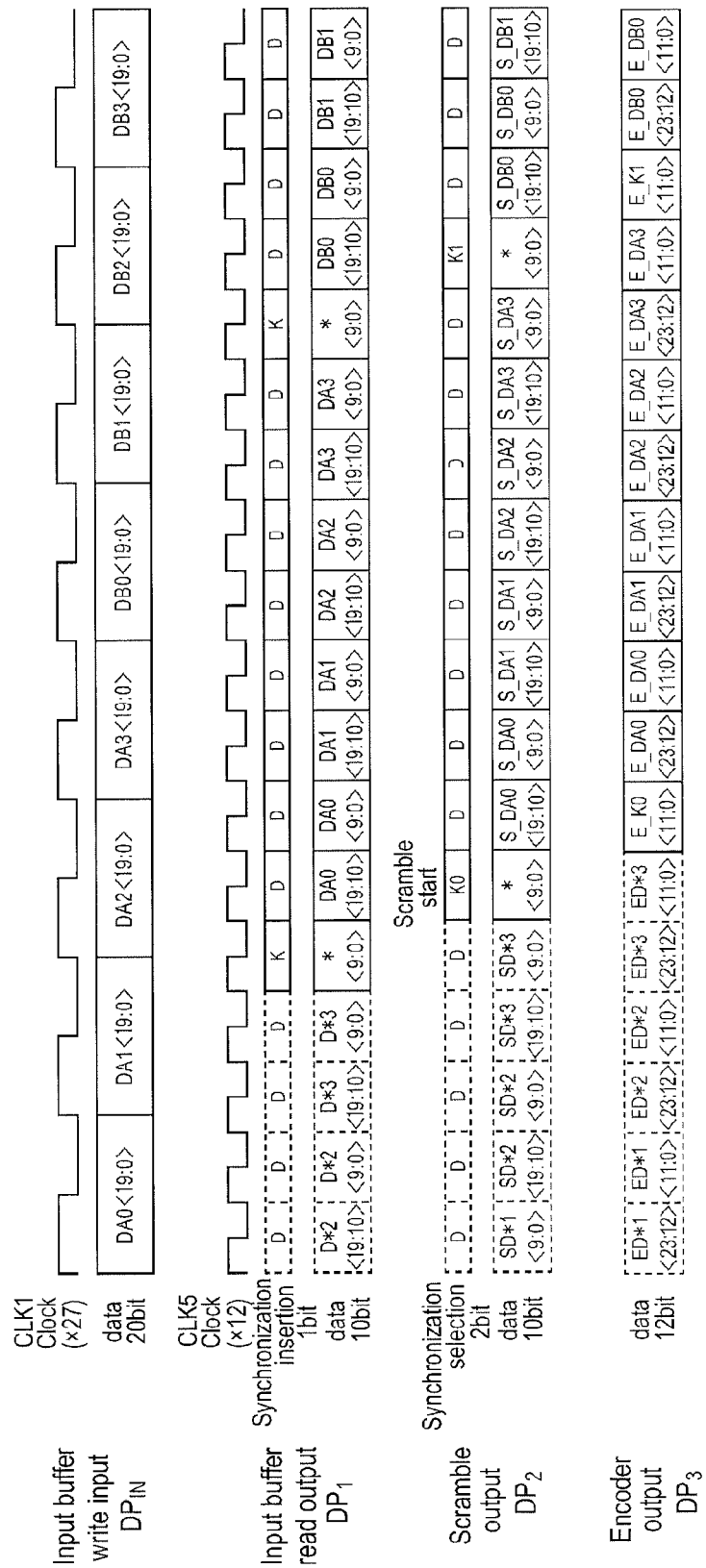
FIG. 4 is a timing chart showing an operation of the transmitting circuit of FIG. 3.

The above description describes the configuration of the transmitting circuit 200. An operation of the transmitting circuit 200 will now be described. FIG. 4 is a timing chart showing an operation of the transmitting circuit 200 of FIG. 3. The 20-bit parallel data $DP_{IN}$ (DA0[19:0], DA1[19:0], DA2[19:0], DA3[19:0], DB0[19:0], DB1[19:0], DB2[19:0], ...) is written to the input buffer 210 in order, in synchronization with the input clock signal CLK1.

A synchronization insertion bit K is asserted at a frequency of one per 9 cycles in synchronization with the intermediate clock signal CLK5. Data is allocated to the remaining 8 cycles. After the synchronization insertion bit K is asserted, the 20-bit data written to the input buffer 210 is divided into upper 10 bits [19:10] and lower 10 bits [9:0].

The scrambled data S_DA0[19:10], S_DA0[9:0], S_DA1[19:10], S_DA1[9:0], . . . is output from the scrambler 212 in order. The encoder 214 encodes the data from the scrambler 212 and outputs 12-bit symbols E_K0[11:0], E_DA0[23:12], E_DA0[11:0], . . . in order.

The serial data $DS_{OUT}$ in which data change (level shift) is produced at a statistical rate of 2×q times within p bits is generated by the transmitting circuit 200 of FIG. 3, where p and q are real numbers. For averaging by a scramble, p and q are preferably larger than 256 (=$2^8$).

Figure 5:
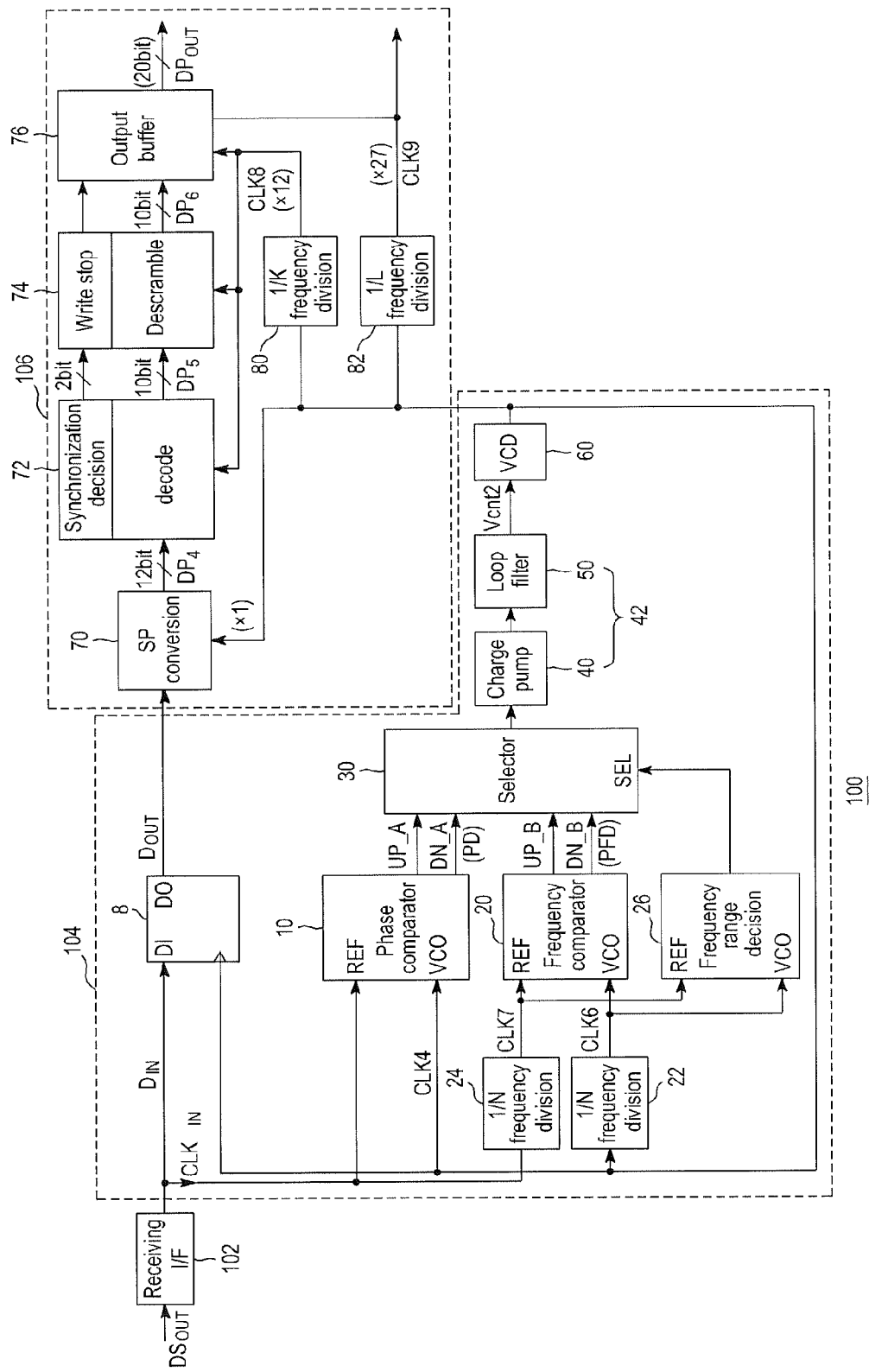
FIG. 5 is a block diagram showing the configuration of a receiving circuit according to an embodiment.

Subsequently, the receiving circuit 100 will be described. FIG. 5 is a block diagram showing the configuration of the receiving circuit 100 according to an embodiment.

The receiving circuit 100 includes the differential receiver 102, the CDR circuit 104 and the signal processing circuit 106. The differential receiver 102 receives differential serial data $DS_{OUT}$. Based on received serial data $D_{IN}$, the CDR circuit 104 recovers a sampling clock signal CLK4 having the same frequency as the transmitting clock signal CLK2 in the transmitting circuit 200 and samples the serial data $D_{IN}$ using the sampling clock signal CLK4.

The CDR circuit 104 includes a sampling circuit 8, a phase comparator 10, a frequency comparator 20, a selector 30, a charge pump circuit 40, a loop filter 50 and a voltage controlled oscillator (VCO) 60.

The CDR circuit 104 receives differential serial data $D_{IN}$+ and $D_{IN}$− (hereinafter, referred to as "input data $D_{IN}$"). As described above, the reference clock signal CLK3 at the transmitting side is embedded in the input data $D_{IN}$.

The VCO 60, a first frequency divider 22, a second frequency divider 24, the frequency comparator 20, the selector 30 and a control voltage generating circuit 42 form a so-called frequency locked loop (FLL) circuit.

The VCO 60 generates the sampling clock signal CLK4 by oscillation with a frequency based on a control voltage Vcnt2. The first frequency divider 22 divides the frequency of the sampling clock signal CLK4 at a division rate M. The second frequency divider 24 divides a clock signal $CLK_{IN}$ based on the received serial data $D_{IN}$ at a division rate N, where the division rate N is expressed by N=M×q/p. The division rates M and N are not limited to an integer but may be a non-integer if a frequency divider of a pulse swallow type is used.

For example, when p is 5376 (=448×12 bits) and q is 3072 (=256×12 bits), M may be 7 and N may be 4, or M may be 3.5 and N may be 2.

The frequency comparator 20 receives an output signal CLK6 of the first frequency divider 22 and an output signal CLK7 of the second frequency divider 24 and generates a phase/frequency difference signal PFD based on the phase difference between these signals. The phase/frequency difference signal PFD includes a down signal DN_B asserted when the phase of the clock signal CLK6 leads the phase of the clock signal CLK7, and an up signal UP_B asserted when the phase of the clock signal CLK6 lags behind the phase of the clock signal CLK7.

Not accounting for the selector 30 for now, the phase/frequency difference signal PFD is input to the control voltage generating circuit 42. The control voltage generating circuit 42 generates the control voltage Vcnt2 to control the frequency of the voltage controlled oscillator 60 based on the phase/frequency difference signal PFD. The charge pump circuit 40 increases the control voltage Vcnt1 when the up signal UP_B is asserted and decreases the control voltage Vcnt1 when the down signal DN_B is asserted. The loop filter 50 is a lag/lead filter to control high frequency components of the control voltage Vcnt1 in order to generate the control voltage Vcnt2. A low pass filter may be used as the loop filter 50.

The charge pump circuit 40 may include, for example, a capacitor, a charging circuit to charge the capacitor in response to the up signal UP_B, and a discharging circuit to discharge the capacitor in response to the down signal DN_B, although it is not limited thereto. The control voltage Vcnt2 is output to the VCO 60.

The above description describes the configuration of the FLL circuit related to the recovery of the sampling clock signal CLK4 in the CDR circuit 104. Subsequently, an operation of the CDR circuit 104 (FLL circuit) will be described.

The frequency of the sampling clock signal CLK4 is fed back and locked by the CDR circuit 104 such that it becomes M/N times as high as the frequency of the input data $D_{IN}$. An average frequency of the input data $D_{IN}$ corresponds to the frequency of the reference clock signal CLK3 embedded in the input data $D_{IN}$. Accordingly, the frequency $f_4$ of the sampling clock signal CLK4 becomes M/N times as high as the frequency $f_3$ of the reference clock signal CLK3 as follows.

$$f_4 = f_3 \times M/N \quad (1)$$

As described above, in the transmitting circuit 200, the input data $D_{IN}$ is generated such that data change (level shift) is produced at a statistical rate of 2×q times within subsequent p bits. Considering that a signal cycle is defined by a pair of two level shifts (edges), the frequency $f_3$ of the reference clock signal CLK3 embedded in the input data $D_{IN}$ is q/p times as high as the frequency $f_2$ of the transmitting clock signal CLK2 as follows.

$$f_3 = f_2 \times q/p \quad (2)$$

Considering the above equations (1) and (2) and N=M×q/p, the following relationship is established.

$$f_4 = f_2 \quad (3)$$

That is, the CDR circuit 104 can recover the sampling clock signal CLK4 having a frequency equal to the frequency $f_2$ of the transmitting clock signal CLK2.

The sampling circuit 8 samples (latches) the input data $D_{IN}$ using the recovered sampling clock signal CLK4. Serial data $D_{OUT}$ as a result of the sampling is provided to the signal processing circuit 106.

Figure 6:
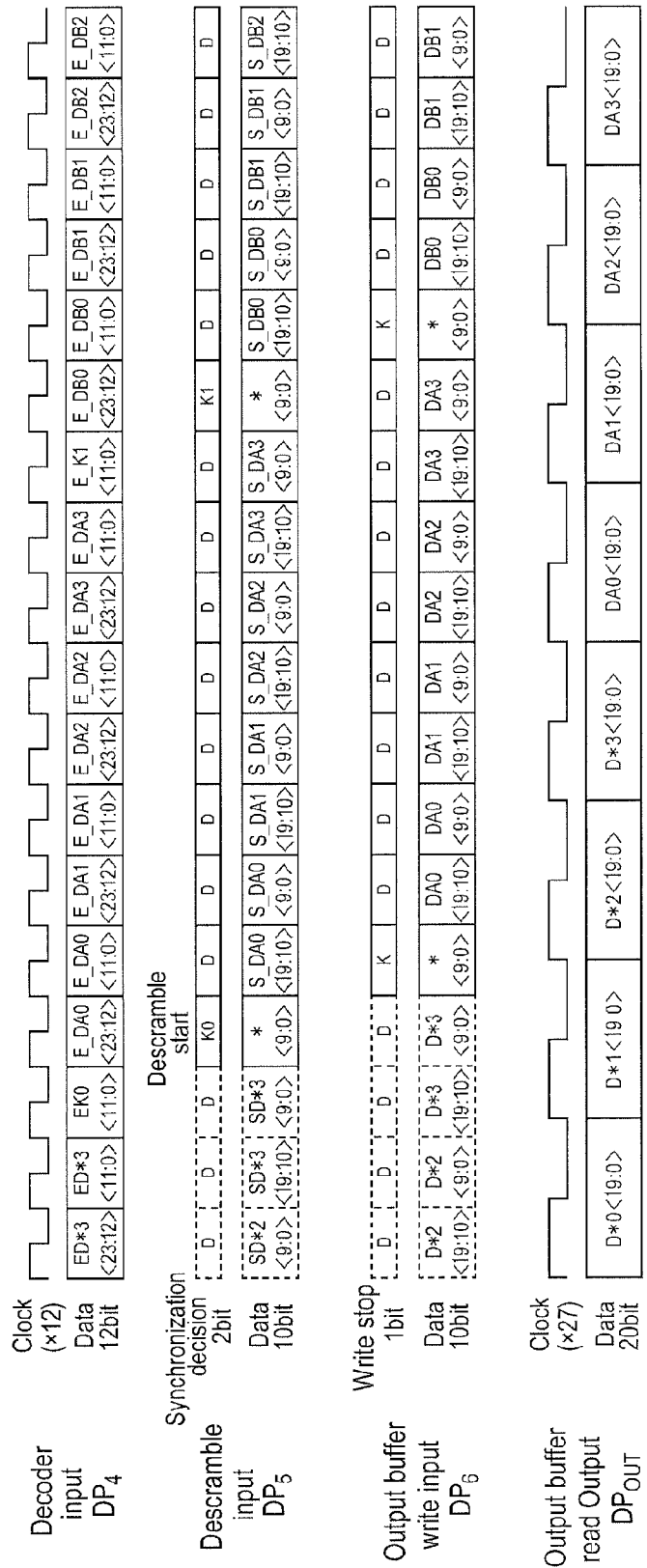
FIG. 6 is a timing chart showing an operation of the signal processing circuit of FIG. 5.

The signal processing circuit 106 performs a process reverse to the process of the signal processing circuit 204 of the transmitting circuit 200. FIG. 6 is a timing chart showing an operation of the signal processing circuit 204.

A third frequency divider 80 generates a clock signal CLK8 by dividing the frequency of the sampling clock signal CLK4 at a division rate K (=12). A fourth frequency divider 82 generates a clock signal CLK9 by dividing the frequency of the sampling clock signal CLK4 at a division rate L (=27).

A serial-parallel converter 70 uses the sampling clock signal CLK4 to convert the sampled serial data $D_{OUT}$ into 12-bit parallel data $DP_4$. A decoder 72 operates in synchronization with the clock signal CLK8 to detect synchronization codes (K symbols) and decode the data $DP_4$ 10B/12B-encoded in the transmitting circuit 200 into 10-bit parallel data $DP_5$. A descrambler 74 releases the scramble performed in the transmitting circuit 200. Parallel data $DP_6$ as a result of the descrambling by the descrambler 74 is written to an output buffer 76. The parallel data $DP_6$ is inhibited from being written if it corresponds to the synchronization codes (K symbols). The data written to the output buffer 76 is read out in synchronization with the clock signal CLK9.

The receiving circuit 100 includes a PLL circuit in addition to a FLL circuit. The PLL circuit includes a phase comparator 10, a control voltage generating circuit 42 and a VCO 60. That is, the PLL circuit and the FLL circuit share the control voltage generating circuit 42 and the VCO 60.

The phase comparator 10 generates a phase difference signal PD based on the difference in phase between the input data $D_{IN}$ and the sampling clock signal CLK4. The phase difference signal PD compares a timing of an edge of the input data $D_{IN}$ with a timing of a corresponding edge of the sampling clock signal CLK4. The phase difference signal PD includes an up signal UP_A asserted when the timing of the edge of the input data $D_{IN}$ is fast, and a down signal DN_A asserted when the timing of the edge of the input data $D_{IN}$ is slow.

A selector 30 is provided to switch between the FLL circuit and the PLL circuit. The selector 30 first selects a phase/frequency difference signal PFD from the frequency comparator 20 to enable the FLL circuit. A frequency range decider 26 compares the frequencies of two clock signals CLK6 and CLK7 to detect whether or not the FLL circuit is locked, i.e., the sampling clock signal CLK4 is recovered. If it is detected that the FLL circuit is locked, the frequency range decider 26 causes the selector 30 to select the phase difference signal PD, thereby enabling the PLL circuit.

The above description describes the transmitting circuit 200. In this way, by using the CDR circuit 104 of FIG. 5, serial data can be transmitted at a high speed by means of only a single transmission line L1.

Figure 7:
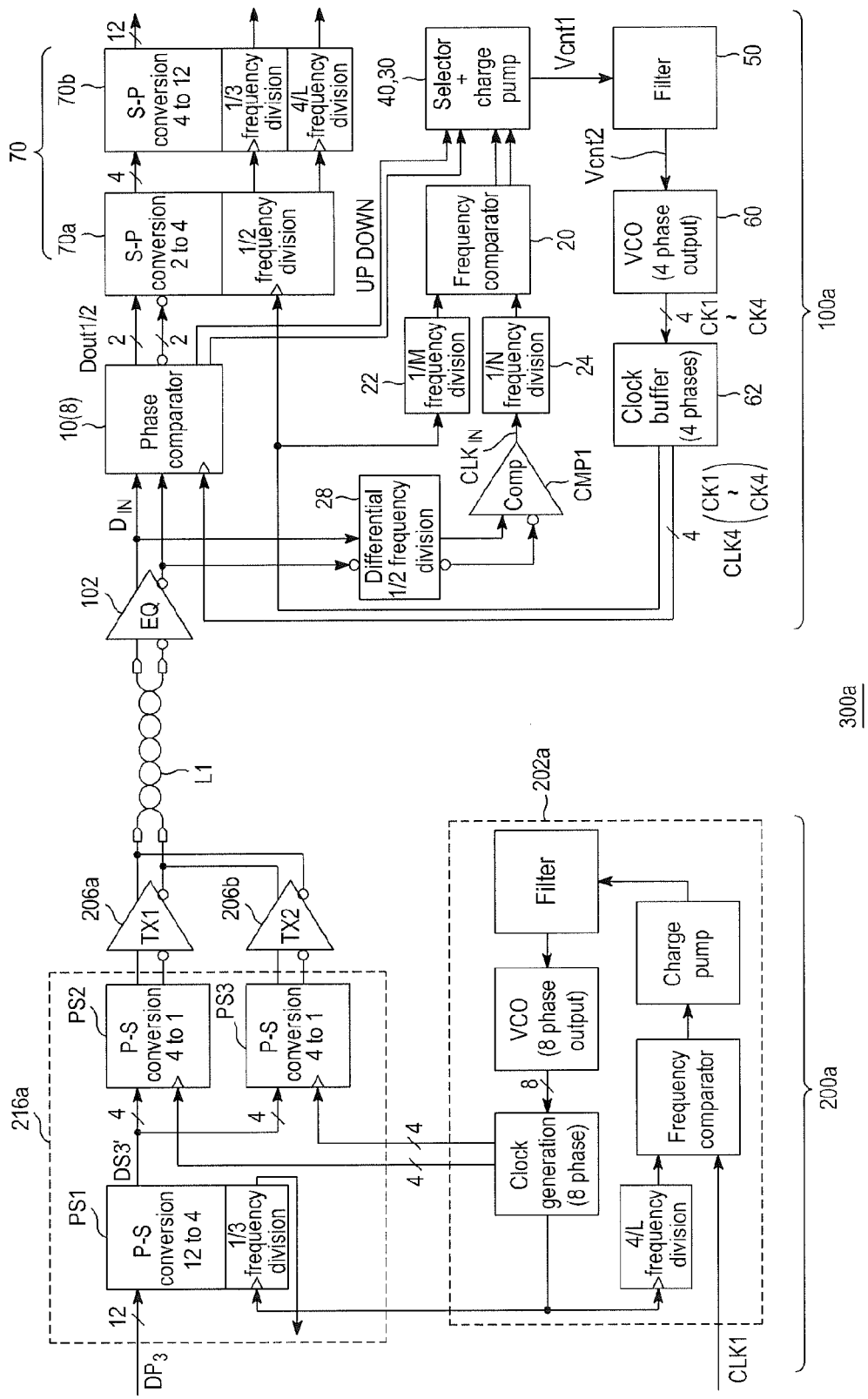
FIG. 7 is a block diagram showing the configuration of a transmission system.

Subsequently, another configuration of the transmission system 300 according to an embodiment will be described. FIG. 7 is a block diagram showing a configuration of a transmission system 300a. The transmission system 300a includes a transmitting circuit 200a and a receiving circuit 100a. The basic configuration of the transmitting circuit 200a and the receiving circuit 100a is similar to those shown in FIGS. 3 and 5.

A configuration of the transmitting circuit 200a will be first described. The transmitting circuit 200a has a pre-emphasis function and includes two differential transmitters 206a and 206b whose outputs are connected in common. As an output signal having a smaller amplitude from the differential transmitter 206b is superimposed on, that is, added to or subtracted from, an output signal having a larger amplitude from the differential transmitter 206a, level shift of a signal transmitted along the transmission line L1 is emphasized to shape a waveform of the signal.

A parallel-serial converter 216a includes parallel-serial converters PS1 to PS3. The parallel-serial converters PS2 and PS3 correspond to the differential transmitters 206a and 206b, respectively. 12-bit parallel data $DP_3$ is input to the parallel-serial converter PS1. The parallel-serial converter PS1 converts the parallel data $DP_3$ into 4-bit parallel data DP3'.

A VCO of a PLL circuit 202a generates 8-phase clock signals with their phases shifted from each other by 45 degrees. Among these, a group of even-numbered clock signals is provided to the parallel-serial converter PS2 and a group of odd-numbered clock signals is provided to the parallel-serial converter PS3. The parallel-serial converters PS2 and PS3 convert the input 4-bit parallel data into serial data.

The differential transmitters 206a and 206b convert the serial data received from the parallel-serial converters PS2 and PS3, with their phases shifted from each other by 45 degrees, that is, ½ of a data cycle, into differential signals, respectively. The outputs of the two differential transmitters 206a and 206b are superimposed to output a pre-emphasized differential signal.

An emphasis period may be set to be equal to a data period. In this case, an output of the VCO may be in 4-phase and 90° phase-shifted clocks are provided to the parallel-serial converters PS2 and PS3, respectively. If the emphasis function is not needed, the VCO has a 4-phase output and the parallel-serial converter PS3 and the differential transmitter 206b are excluded.

The above description describes the configuration of the transmitting circuit 200a. Subsequently, the receiving circuit 100a will be described. Differential serial data $D_{IN}$ received by a differential receiver 102 is frequency-divided at a division rate of ½ by means of a frequency divider 28 and is converted into a single-ended clock signal $CLK_{IN}$ by means of a comparator CMPL A CVO 60 generates 4-phase clock signals CK1 to CK4 having a frequency corresponding to ½ of a data rate. The 4-phase clock signals CK1 to CK4 are phase-shifted from each other by a ¼ cycle (90 degrees). The 4-phase clock signals CK1 to CK4 correspond to the sampling clock signal CLK4. The sampling clock signal CLK4 is provided to a phase comparator 10(8) and a serial-parallel converter 70 via a clock buffer 62.

In FIG. 7, the phase comparator 10 also has the same function as the sampling circuit 8. The phase comparator 10 uses the first and third clock signals CK1 and CK3, with their phases shifted from each other by 180 degrees, among the 4-phase clock signals CK1 to CK4 to acquire two data $D_{OUT}1$ and $D_{OUT}2$ for each cycle of the clock signals. More specifically, a value of the input data $D_{IN}$ is latched at a timing of a positive edge of the first clock signal CK1 and is taken as the data $D_{OUT}1$ and a value of the input data $D_{IN}$ is latched at a timing of a positive edge of the third clock signal CK3 and is taken as the data $D_{OUT}2$. The data $D_{OUT}1$ and $D_{OUT}2$ are provided to the serial-parallel converter 70 at the next stage. The serial-parallel converter 70 includes two stages 70a and 70b.

Figure 8:
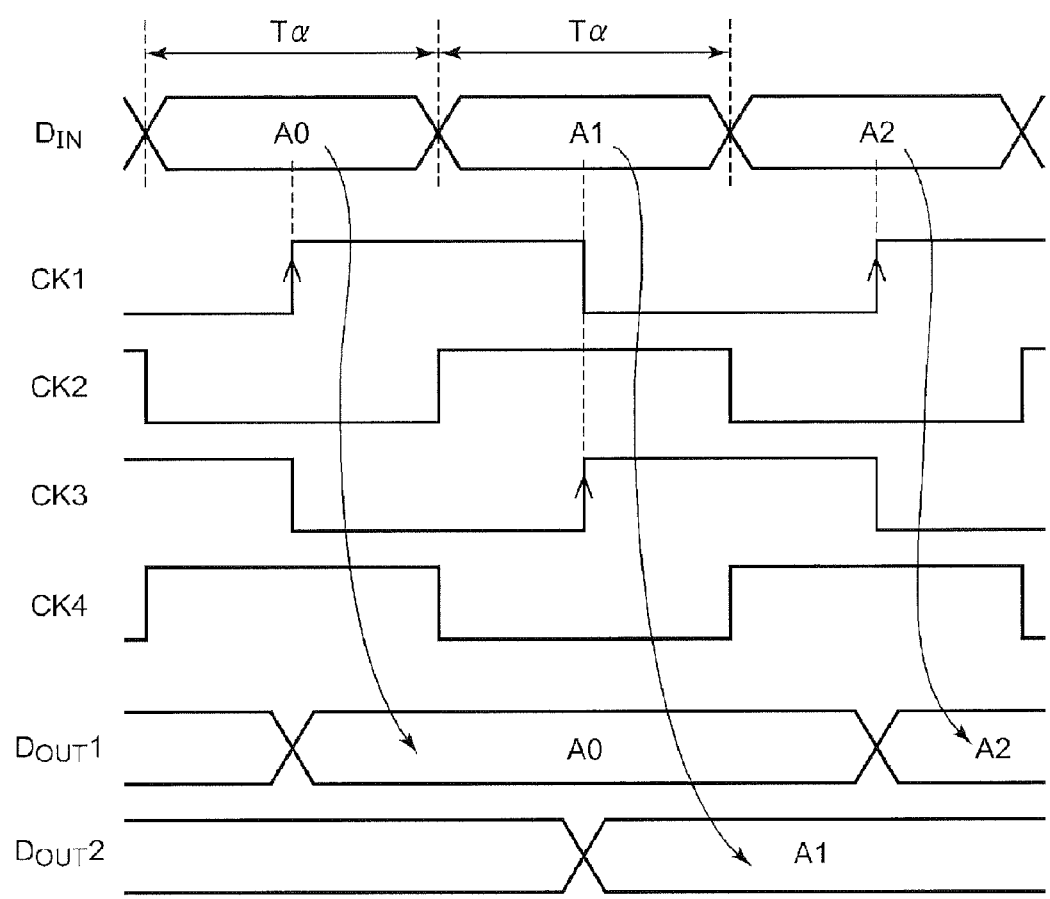
FIG. 8 is a timing chart showing timings of various signals in a receiving circuit in FIG. 7.

FIG. 8 is a timing chart showing timings of various signals in the receiving circuit 100a in FIG. 7.

Referring to FIG. 7 again, the serial-parallel converter 70 converts the serial data $D_{OUT}1$ and $D_{OUT}2$ and the clock signals CK1 and CK2 synchronized with the serial data $D_{OUT}1$ and $D_{OUT}2$ into output parallel data $D_{OUT}$ at a timing of the serial data $D_{OUT}1$ and $D_{OUT}2$. The serial-parallel converter 70 outputs the output parallel data DOUT to a processing block at the next stage, along with a clock signal $CK_{OUT}$ synchronized with the output parallel data $D_{OUT}$.

The phase comparator 10, the charge pump circuit 40, the loop filter 50 and the VCO 60 form a so-called phase locked loop (PLL) circuit. The frequencies and phases of the clock signals CK1 to CK4 are feedback-controlled by this PLL circuit such that a timing of an edge of the second clock signal CK2 and a timing of an edge of the fourth clock signal CK4 coincide with a change point of the input data $D_{IN}$.

The VCO 60 oscillates with a frequency based on a control voltage Vcnt2 input thereto. The VCO 60 generates the 4-phase clock signals CK1 to CK4. For example, the VCO 60 is a ring oscillator having four delay elements connected in the form of a ring. Each delay element is biased by the control voltage Vcnt2 and an amount of delay thereof is controlled by the control voltage Vcnt2. As a result, the oscillation frequency of the ring oscillator depends on the control voltage Vcnt2. The 4-phase clock signals CK1 to CK4 correspond to input signals (or output signals) of the four delay elements.

The phase comparator 10 receives the input data $D_{IN}$ and the clock signals CK1 to CK4. The phase comparator 10 compares a phase of the input data $D_{IN}$ with respective phases of the clock signals CK1 to CK4 and generates an up signal UP_A and a down signal DN_A. The up signal UP_A and the down signal DN_A may be also collectively called the "phase difference signal PD_A."

The up signal UP_A is asserted (i.e., goes to a High level) when the phases of the clock signals CK lag behind the phase of the input data $D_{IN}$ and the down signal DN_A is asserted when the phases of the clock signals CK lead the phase of the input data $D_{IN}$.

The phase difference signal PD_A is input to the charge pump circuit 40 via the selector 30. The charge pump circuit 40 increases a control voltage Vcnt1 when the up signal UP_A is asserted and decreases the control voltage Vcnt1 when the down signal DN_A is asserted. The loop filter 50 is a lag/lead filter to control high frequency components of the control voltage Vcnt1 to generate the control voltage Vcnt2. A low pass filter may be used as the loop filter 50.

When the phases of the clock signals CK lag and the up signal UP_A is asserted, the control voltage Vcnt2 increases and accordingly a feedback is provided in such a manner that the clock signals CK increase in terms of frequency and lead in terms of phase. Conversely, when the phases of the clock signals CK lead and the down signal DN_A is asserted, the control voltage Vcnt2 decreases and accordingly a feedback is provided in such a manner that the clock signals CK decrease in terms of frequency and lag in terms of phase. As a result, the frequencies and phases of the clock signals CK are optimized on the basis of the change point (edge) of the input data $D_{IN}$.

Apart from the above-described PLL circuit, the frequency comparator 20, the first frequency divider 22, the second frequency divider 24, the charge pump circuit 40, the loop filter 50 and the VCO 60 form a FLL circuit.

The frequencies and phases of the clock signals CK1 to CK4 are feedback-controlled by this FLL circuit such that cycles of the clock signals CK2 and CK4 coincide with a data cycle Td of the input data $D_{IN}$.

The comparator CMP1 compares input data $D_{IN}+$ and $D_{IN}-$ and generates a reference signal Ref. The frequency comparator 20 compares output signals of the first frequency divider 22 and the second frequency divider 24 and generates a phase/frequency difference signal PFD based on the phase difference between the output signals.

The phase/frequency difference signal PFD is input to the charge pump circuit 40 via the selector 30. Operation of the charge pump circuit 40, the loop filter 50 and the VCO 60 is as described above.

The frequencies and phases of the clock signals CK1 to CK4 are feedback-controlled by the FLL circuit such that a gap between positive edges of the clock signals CK2 and CK4 coincides with a cycle of the input data $D_{IN}$.

Figure 9:
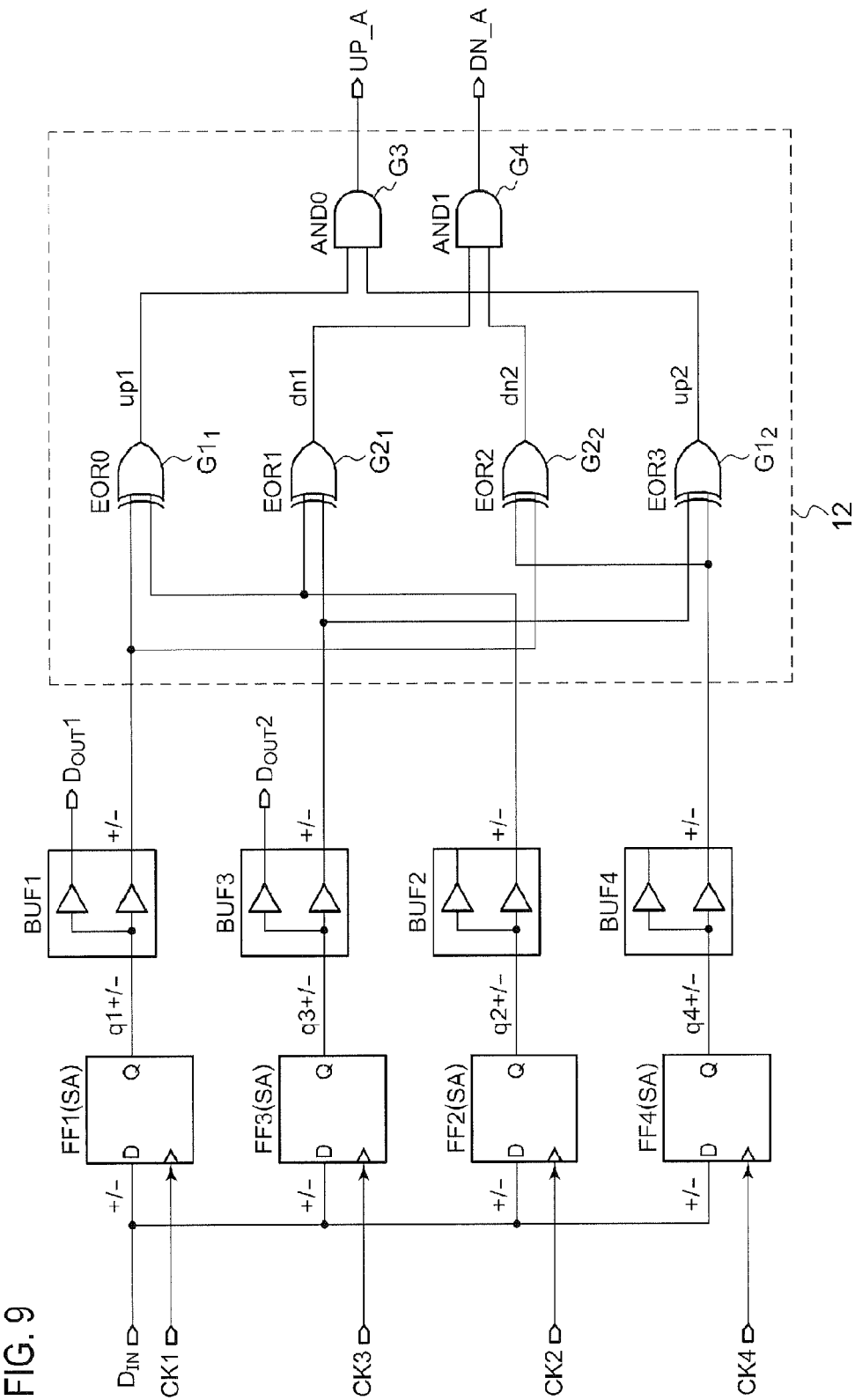
FIG. 9 is a circuit diagram showing the configuration of a phase comparator in FIG. 7.

The above description describes a configuration of the receiving circuit 100a. Subsequently, a detailed configuration of the phase comparator 10 will be described. FIG. 9 is a circuit diagram showing a configuration of the phase comparator 10 in FIG. 7. The phase comparator 10 includes flip-flops FF1 to FF4, buffers BUF1 to BUF4 and a decoder circuit 12.

The flip-flops FF1 to FF4 are respectively provided for the clock signals CK1 to CK4. An i-th flip-flop FFi (1≦i≦4) compares input signals $D_{IN}+$ and $D_{IN}-$ (single ended conversion) and latches data indicating a comparison result at a timing of a positive edge of a corresponding clock signal CKi. This flip-flop may be referred to as a sense amplifier (SA).

Data q1 latched by the flip-flop FF1 is output as data $D_{OUT}1$ via the buffer BUF1. Similarly, data q2 latched by the flip-flop FF2 is output as data $D_{OUT}2$ via the buffer BUF2.

Data q1 to q4 generated by the respective flip-flops FF1 to FF4 are input to the decoder circuit 12 at a later stage via the buffers BUF1 to BUF4. The decoder circuit 12 generates phase difference signals PD_A (up signal UP_A and down signal DN_A) based on the data q1 to q4.

The decoder circuit 12 includes a plurality of first logic gates G1, a plurality of second logic gates G2, a third logic gate G3 and a fourth logic gate G4.

The first logic gates $G1_1$ and $G1_2$ are respectively provided for odd-numbered flip-flops FF1 and FF3. It is hereby noted that reference numerals FF1, FF3, FF5, . . . denote the odd-numbered flip-flops when a phase number is greater than 4. In other words, odd-numbered flip-flops are meant to include one flip-flop corresponding to a clock signal for latching the data $D_{OUT}1$ and $D_{OUT}2$ and the other flip-flops alternatively arranged following the one flip-flop.

An i-th (i being a natural number) first logic gate $G1_i$ is configured to generate an internal up signal upi asserted (high level) when an output of a (2×i−1)-th flip-flop $FF_{2\times i-1}$ is unequal to an output of a (2×i)-th flip-flop $FF_{2\times i}$.

The second logic gates $G2_1$ and $G2_2$ are respectively provided for even-numbered flip-flops FF2 and FF4. It is hereby noted that reference numerals FF2, FF4, FF6, . . . denote the even-numbered flip-flops when a phase number is greater than 4.

A j-th (j being an even number) second logic gate $G2_j$ is configured to generate an internal down signal dni asserted (i.e., having a High level) when an output of a (2×j)-th flip-flop $FF_{2\times j}$ is unequal to an output of a (2×j+1)-th flip-flop $FF_{2\times j+1}$.

For example, the first logic gates G1 and the second logic gates G2 may be configured using exclusive OR gates (EOR).

More specifically, a logic gate EOR0 ($G1_1$) compares data q1 and data q2 and generates an internal up signal up1 indicating equality or inequality. A logic gate EOR1 ($G2_1$) compares data q2 and data q3 and generates an internal down signal dn1 indicating equality or inequality. A logic gate EOR2 ($G2_2$) compares data q4 and data q1 and generates an internal down signal dn2 indicating equality or inequality. A logic gate EOR3 ($G1_2$) compares data q3 and data q4 and generates an internal up signal up2 indicating equality or inequality. Outputs of the logic gates EOR0 to EOR3 become 0 (Low level) when their respective input signals are equal to each other and become 1 (High level) when they are unequal to each other.

The third logic gate G3 (AND0) generates an up signal UP_A based on the internal up signals up1 and up2 generated by the respective first logic gates $G1_1$ and $G1_2$. More specifically, the third logic gate G3 is an AND gate and assets the up signal UP_A when both of the internal up signals up1 and up2 are asserted.

The fourth logic gate G4 (AND1) is an AND gate and generates a down signal DN_A based on the internal down signals dn1 and dn2 generated by the respective second logic gates $G2_1$ and $G2_2$. More specifically, the fourth logic gate G4 assets the down signal DN_A when both of the internal down signals dn1 and dn2 are asserted.

The above description describes a configuration of the phase comparator 10. Subsequently, an operation of the phase comparator 10 will be described. FIGS. 10A, 10B, 11A and 11B are timing charts showing operations of the phase comparator 10 in FIG. 9. FIGS. 10A, 10B, 11A and 11B show operations of the phase comparator 10 when the input data $D_{IN}$ is changed once, continuously twice, continuously three times, and discontinuously twice, respectively.

Figure 10A:
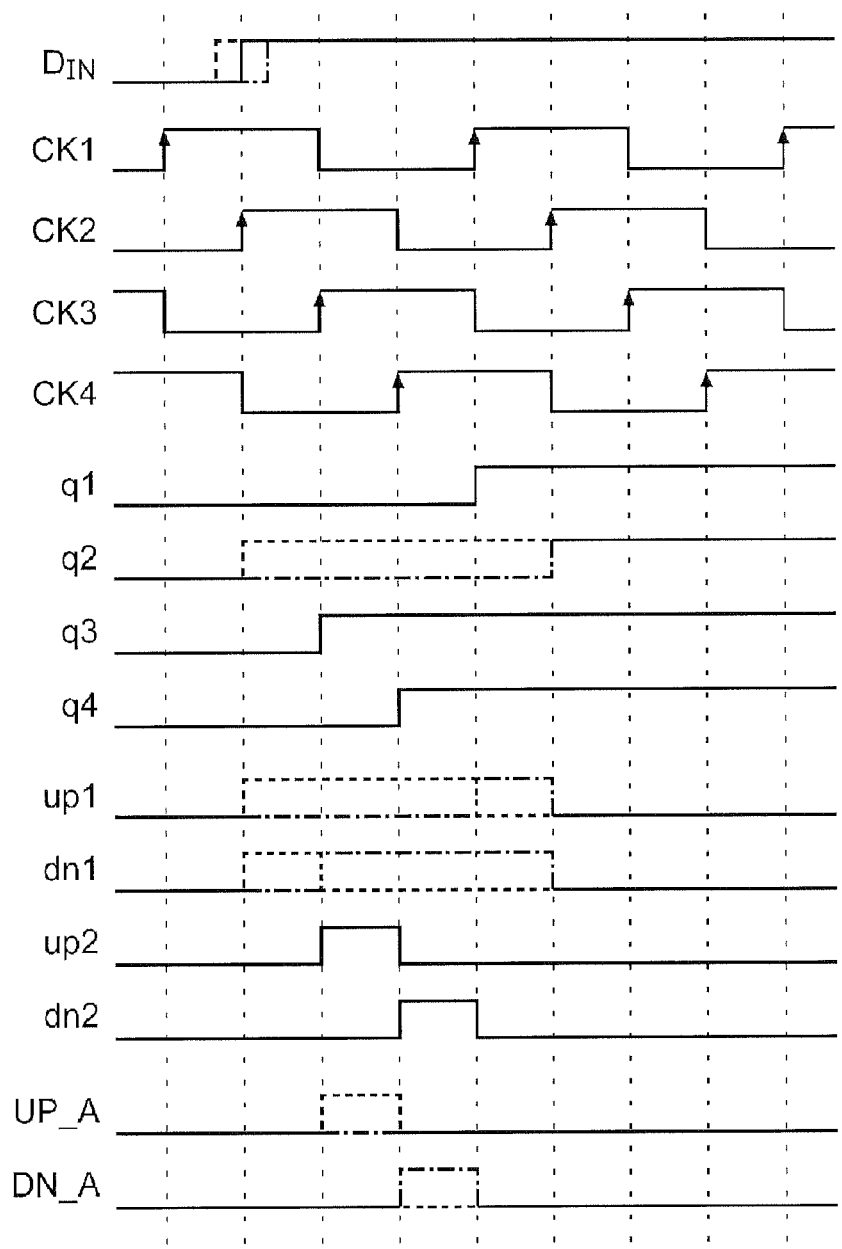

As shown in FIG. 10A, when the input data $D_{IN}$ is changed once, an up signal UP_A having a length of one interval (¼ of a cycle of a clock signal) is generated if a phase of the input data $D_{IN}$ leads. Conversely, a down signal DN_A having a length of one interval (¼ of a cycle of a clock signal) is generated if a phase of the input data $D_{IN}$ lags.

Referring to FIG. 10B, when the input data $D_{IN}$ is changed continuously twice, an up signal UP_A having a length of three intervals (¾ of a cycle of a clock signal) is generated if a phase of the input data $D_{IN}$ leads. Conversely, a down signal DN_A having a length of three intervals (¾ of a cycle of a clock signal) is generated if a phase of the input data $D_{IN}$ lags.

Figure 11A:
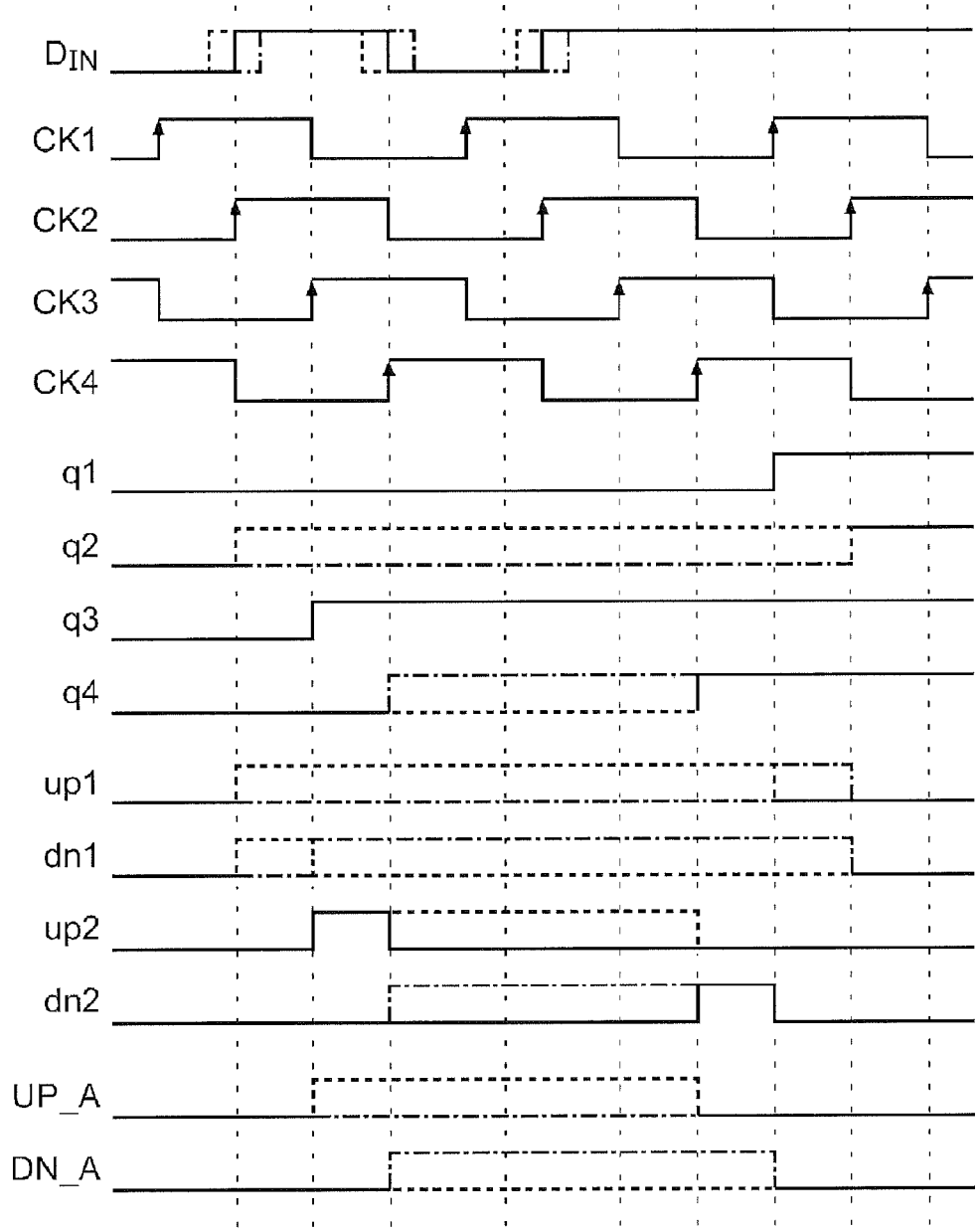

Referring to FIG. 11A, when the input data $D_{IN}$ is changed continuously three times, an up signal UP_A having a length of five intervals (5/4 of a cycle of a clock signal) is generated if a phase of the input data $D_{IN}$ leads. Conversely, a down signal DN_A having a length of five intervals (5/4 of a cycle of a clock signal) is generated if a phase of the input data $D_{IN}$ lags.

Referring to FIG. 11B, when the input data $D_{IN}$ is changed discontinuously, the operation similar to the once change operation of FIG. 10A is repeated twice.

In this manner, the phase comparator 10 of this embodiment can generate the up signal UP_A and the down signal DN_A asserted during a period of time depending on the number of times of the continuous change of the input data $D_{IN}$.

In addition, the phase comparator 10 has the advantage of low delay since it does not take timing for synchronization while generating the up signal UP_A and the down signal DN_A. This allows a phase of a clock signal to follow a change of the input data $D_{IN}$ at a high speed.

The phase comparator 10 of FIG. 9 has another advantage in that the minimum width of an assert period of each of a down signal DN and an up signal UP corresponds to one interval (¼ of a cycle of a clock signal or a 90° phase thereof). That is, the small minimum width of the down signal DN_A and the up signal UP_A can increase the degree of freedom of the design of the charge pump circuit 40.

In general, the charge pump circuit 40 includes a capacitor, a charging circuit which charges the capacitor according to an up signal UP, and a discharging circuit which discharges the capacitor according to a down signal DN. A voltage across the capacitor is output as a control voltage Vcnt1. Accordingly, a variation ΔV of the control voltage Vcnt1 is expressed as follows:

$$\Delta V = \tau \times Ichg / C$$

where, τ is a pulse width of the up signal UP and the down signal DN, Ichg is a charging/discharging current and C is a capacitance of the capacitor.

Accordingly, in order to obtain the variation ΔV of the same control voltage Vcnt1, a shorter pulse width can provide a larger charging/discharging current Ichg or a smaller capacitance C of the capacitor. The smaller capacitance C means a smaller circuit area, which is very useful for circuit integration. In addition, the larger charging/discharging current Ichg means a higher precision, which is very useful in increasing the precision of frequency stabilization of a CDR circuit.

Hitherto, the present disclosure has been described based on the embodiments. The embodiments are only examples and elements, processes and combinations thereof may be modified in various ways. These modifications will be described below.

Although the 4-phase clock signal recovery has been illustrated in FIG. 7, it should be understood by those skilled in the art that the technical ideas disclosed in the above embodiments can be applied to 8-phase, 16-phase or other phase clock signals, which are also included in the scope of the present disclosure.

According to the aforementioned embodiments, it is possible to transmit serial data at a high speed via a single transmission line.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A receiving circuit which receives serial data, comprising:
    a voltage controlled oscillator which generates a sampling clock signal having a frequency based on an input control voltage;
    a first frequency divider which divides the frequency of the sampling clock signal at a division rate M, the division rate M being a real number;
    a second frequency divider which divides a frequency of a clock signal based on the received serial data at a division rate N, the serial data being generated such that level shift is produced at a rate of $2 \times q$ times within p bits, p and q being real numbers, and the division rate N being a real number represented by $M \times q/p$;
    a frequency comparator which generates a phase/frequency difference signal based on a phase difference between an output signal of the first frequency divider and an output signal of the second frequency divider; and
    a control voltage generating circuit which generates the control voltage to control a frequency of the voltage controlled oscillator based on the phase/frequency difference signal.

2. The receiving circuit of claim 1, wherein the serial data include D symbols in which transmitted information is encoded by 8B/10B, 10B/12B or similar schemes and K symbols which are synchronization control codes inserted at equal intervals between plural D symbols.

3. The receiving circuit of claim 2, wherein the D symbols are scrambled.

4. The receiving circuit of claim 1, further comprising:
    a phase comparator which receives the serial data and the sampling clock signal and generates a phase difference signal based on a phase difference between the serial data and the sampling clock signal; and
    a selector which receives the phase/frequency difference signal and the phase difference signal, selects one of the phase/frequency difference signal and the phase difference signal and outputs the selected signal to the control voltage generating circuit.

5. The receiving circuit of claim 4, wherein the voltage control oscillator generates a multi-phase clock signal as the sampling clock signal, which includes a plurality of clock signals having different frequencies based on the control voltage, with their phases shifted from each other by an equal interval.

6. The receiving circuit of claim 5, wherein the phase comparator generates an up signal and a down signal, which are complementarily asserted, as the phase difference signal, and
    wherein the phase comparator includes:
    a plurality of flip-flops which are provided for the plurality of clock signals and respectively latch the serial data at timings of the corresponding clock signals;
    a plurality of first logic gates which are respectively provided for odd-numbered flip-flops and are configured in such a manner that an i-th first logic gate generates an internal up signal asserted when an output of a $(2 \times i - 1)$-th flip-flop is unequal to an output of a $(2 \times i)$-th flip-flop;
    a plurality of second logic gates which are respectively provided for even-numbered flip-flops and are configured in such a manner that a j-th second logic gate generates an internal down signal asserted when an output of a $(233\ j)$-th flip-flop is unequal to an output of a $(2 \times j + 1)$-th flip-flop;
    a third logic gate which generates the up signal based on a plurality of internal up signals generated by the plurality of first logic gates; and
    a fourth logic gate which generates the down signal based on a plurality of internal down signals generated by the plurality of second logic gates.

7. The receiving circuit of claim 6, wherein the third logic gate asserts the up signal when all of the internal up signals are asserted and the fourth logic gate asserts the down signal when all of the internal down signals are asserted.

8. The receiving circuit of claim 6, wherein the plurality of clock signals has 4-phases.

9. The receiving circuit of claim 6, wherein the phase comparator outputs data retained in the plurality of flip-flops as sampled serial data.

10. The receiving circuit of claim 9, further comprising a serial-parallel converter which performs a serial-parallel operation for the sampled serial data using a clock signal output from the voltage controlled oscillator.

11. A transmission system comprising:
    a transmitting circuit which generates serial data having level shift produced at a rate of $2 \times q$ times within p bits, p and q being real numbers; and
    a receiving circuit of claim 1, which receives the serial data.

12. A method for receiving serial data, comprising:
    generating a sampling clock signal having a frequency based on a control voltage by means of a voltage controlled oscillator;
    dividing the frequency of the sampling clock signal at a division rate M, the division rate M being a real number;
    dividing a frequency of the received serial data at a division rate N, the serial data being generated such that level shift is produced at a rate of $2 \times q$ times within p bits, p and q being real numbers, and the division rate N being a real number represented by $M \times q/p$;
    generating a phase/frequency difference signal based on a phase difference between the frequency-divided sampling clock signal and the frequency-divided serial data; and
    generating the control voltage based on the phase/frequency difference signal.

13. The method of claim 12, further comprising:
    after the sampling clock signal is locked to a predetermined frequency range,
    receiving the serial data and the sampling clock signal and generating a phase difference signal based on a phase difference between the serial data and the sampling clock signal; and generating the control voltage based on the phase difference signal.

14. A transmission method comprising:

generating serial data having level shift produced at a rate of 2×q times within p bits, p and q being real numbers, at a transmitting side;

generating a sampling clock signal having a frequency based on a control voltage by means of a voltage controlled oscillator at a receiving side;

dividing the frequency of the sampling clock signal at a division rate M, the division rate M being a real number;

dividing a frequency of the received serial data at a division rate N, the division rate N being a real number represented by M×q/p;

generating a phase/frequency difference signal based on a phase difference between the frequency-divided sampling clock signal and the frequency-divided serial data; and generating the control voltage based on the phase/frequency difference signal.

* * * * *